United States Patent [19]

Wandinger et al.

[11] Patent Number: 4,496,913

[45] Date of Patent: Jan. 29, 1985

[54] MILLIMETER WAVE POWER COMBINER USING CONCAVE REFLECTORS

[75] Inventors: Lothar Wandinger, Elberon; Vahakn Nalbandian, Ocean City, both of N.J.

[73] Assignee: The United States of America as represented by the Secretary of the Army, Washington, D.C.

[21] Appl. No.: 444,136

[22] Filed: Nov. 24, 1982

[51] Int. Cl.[3] .......................... H03B 5/18; H03B 7/12; H01P 7/06

[52] U.S. Cl. .......................................... 331/56; 331/97; 331/107 DP; 331/107 P; 333/227; 333/230

[58] Field of Search ........................ 331/55, 56, 96, 97, 331/107 DP, 107 P, 117 D

[56] References Cited

U.S. PATENT DOCUMENTS 3,831,110 8/1974 Eastman ...................... 331/107 P X
4,053,897 10/1977 Nerheim .................. 331/107 DP X
4,309,672 1/1982 Havens .................... 331/107 DP X
4,340,870 7/1982 Dydyk ........................ 331/107 P X

FOREIGN PATENT DOCUMENTS 2015842 9/1979 United Kingdom ............ 331/107 P

*Primary Examiner*—Eugene R. LaRoche
*Assistant Examiner*—W. R. Paxman
*Attorney, Agent, or Firm*—Anthony T. Lane; Michael Zelenka; Jeremiah G. Murray

[57] ABSTRACT

A mm wavelength power combiner comprising an open resonator comprising a pair of confronting concave reflectors which can be either spherical or parabolic. The resonator dimensions are many times the wavelength of the energy sources to be combined. A plurality of mm wave energy sources are applied to the resonator in such a way that the great majority of the energy bounces back and forth between the reflectors near the axis thereof in the fundamental or Gaussian mode. The design minimizes multimoding and diffraction losses.

10 Claims, 6 Drawing Figures

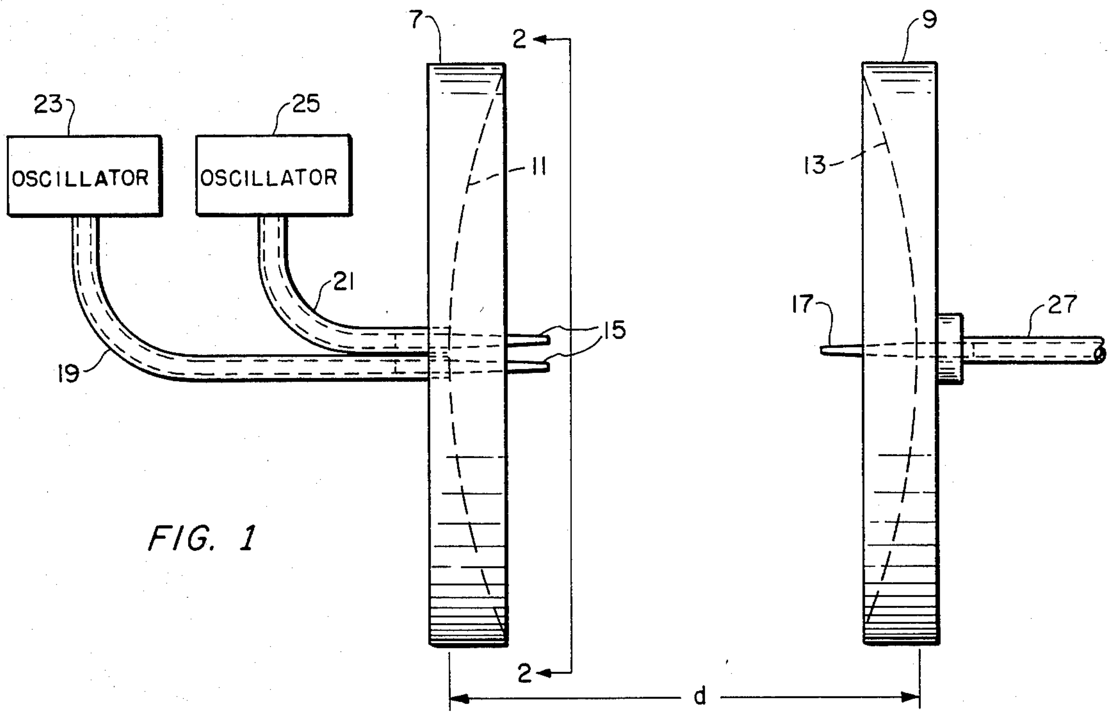
FIG. 1
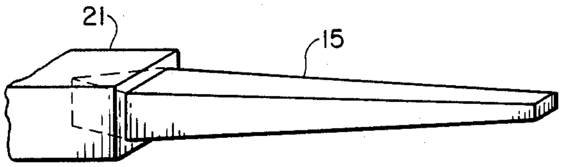
FIG. 3
FIG. 2
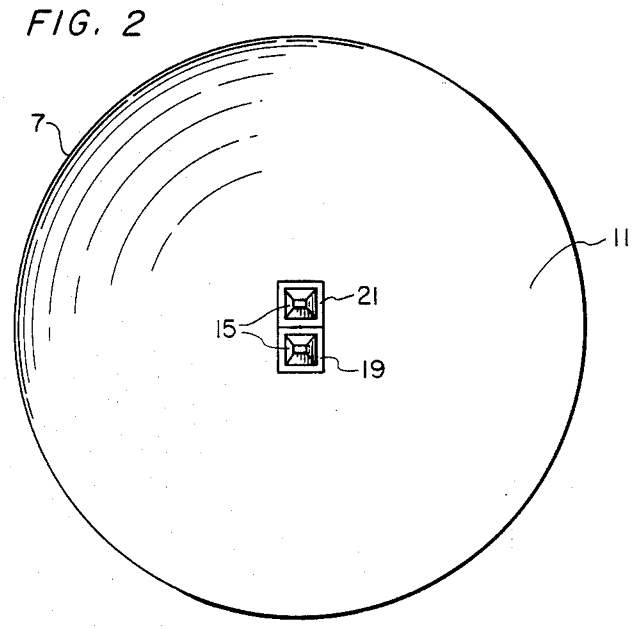

FIG. 4
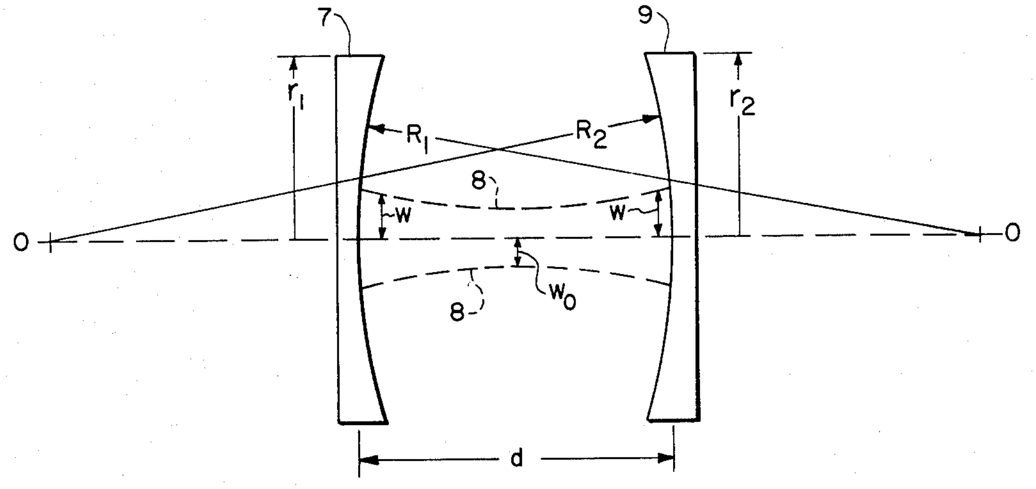
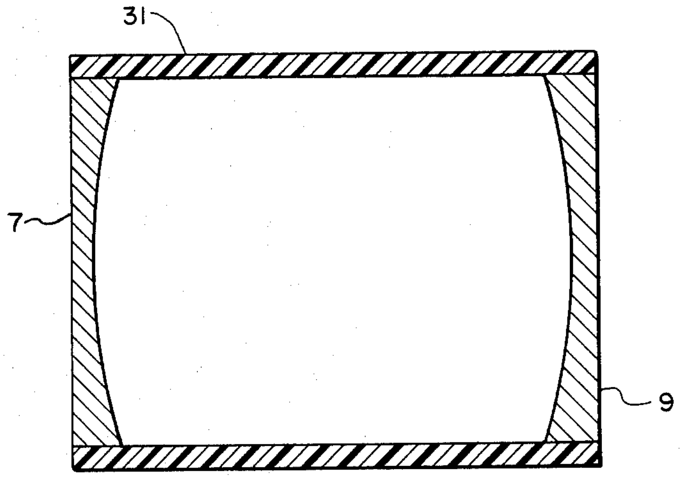
FIG. 5
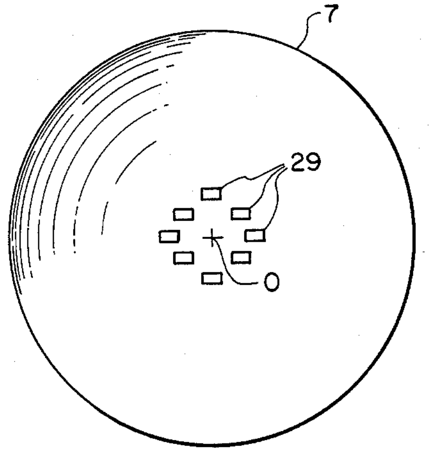
FIG. 6

MILLIMETER WAVE POWER COMBINER USING CONCAVE REFLECTORS

The invention described may be manufactured, used and licensed by or for the Government for governmental purposes without the payment to us of any royalties thereon.

BACKGROUND OF THE INVENTION

In the past many different techniques have been utilized to combine the outputs of millimeter (mm) wavelength solid state devices to obtain a single high power signal. These power combining techniques have included such apparatus as nonresonant hybrid combiners, nonresonant N-way combiners and resonant N-way combiners. Power combining at mm frequencies has evolved from an extension of techniques developed at the lower microwave frequencies by scaling down the microwave hardware to accommodate the mm wavelengths. The most commonly used combining technique at mm wavelengths has been the resonant N-way combiner comprising an enclosed rectangular cavity which combines the outputs of N discrete oscillators, which can be mounted in the cavity walls. These prior art combiners are seriously limited in power output and combining efficiency in this spectral region because of size and volume restrictions thereon necessary to achieve mode separation and to avoid power losses due to multimoding. This follows from the fact that in a closed cavity resonator the number of resonant modes within a given volume is directly proportional to the resonator volume and to the square of the frequency. Consequently, as the frequency increases to the mm region, the mode density increases, mode separation decreases and thus excitation at a single frequency becomes more difficult.

The Gunn and IMPATT devices often used as the active elements for oscillators at mm wavelengths have a negative resistance over a wide frequency range and thus an enclosed cavity used to combine the outputs of such devices must have low mode density and a small volume relative to the operating wavelength if multimoding is to be avoided. This size limitation restricts the number of such oscillator outputs which can be combined with such resonators, and produces fabrication difficulties.

The present invention avoids many of these disadvantages of the prior art by utilizing an open resonator of the type which has heretofore only been used in laser devices at optical wavelengths.

SUMMARY OF THE INVENTION

The quasi-optical resonant power combiner of the present invention comprises an open cavity comprising a pair of confronting reflectors which are preferably concave and can be either sections of spheres or parabolas. One of the reflectors, the input reflector, contains two or more wave launchers arranged near the center thereof which are designed to direct the outputs of the individual solid state oscillators to be combined toward the other reflector, so that the combined energy bounces back and forth between the reflectors to establish a standing wave pattern along the resonator axis. The reflector dimensions and spacing are many times the operating wavelength and thus the loss by diffraction at the reflector edges can be minimized. Also the reflector and launchers are designed so that most of the energy is confined to the region near the resonator axis and the energy is mainly in the fundamental or lowest order TEM (transverse electromagnetic mode) mode which exhibits a Gaussian shape in cross section with negligible longitudinal field components.

The curvature of the reflectors is chosen to match the shape of the wavefront of the desired TEM fundamental mode. This results in suppression of the undesired higher order modes.

Signal interaction occurs between the resonant modes of the resonator and the individual oscillators which are applied thereto. This can result in frequency locking of all the oscillators to the frequency of the combining cavity.

The reflectors can be mounted in a dielectric structure which is transparent at the operating wavelength, for example the reflectors can be mounted at either end of an open hollow cylinder of plastic or dielectric material.

A preferred embodiment of this combiner comprises a pair of identical confronting spherical reflectors with a Fresnel number of 5 or more and with a spacing, d, between reflectors centers of between 1 and 2 times their common focal length.

It is thus an object of the invention to provide a mm wavelength power combiner comprising a pair of concave, confronting reflectors with the outputs of two or more oscillators applied thereto in such a way that standing waves in the TEM mode are set up along the axis connecting the centers of said reflectors, and wherein the said reflectors have diameters and spacing at least 10 times the operating wavelength.

Another object of the invention is to provide a mm wavelength power combiner comprising an open resonant cavity comprising a pair of confronting spherical reflectors with radii of curvature, diameters and spacing at least 10 times the operating wavelength, and with means to launch the outputs of two or more mm wave oscillators along the axis connecting the centers of said reflectors so that standing waves of the fundamental or Gaussian mode are set up within said cavity, and means to withdraw the combined power from said cavity.

A further object of the invention is to provide a resonant cavity similar to those used in lasers to efficiently combine the outputs of a plurality of mm wavelength negative resistance oscillators.

A still further object of the invention is to provide a power combiner for radiation in the mm wavelength region comprising a resonant cavity comprising a pair of confronting concave reflectors with the dimensions of the reflecting surfaces, the diameters and the spacing thereof chosen to minimize diffraction losses and favor the formation of standing waves therein at the fundamental or $TEM_{ooq}$ mode, and wherein said reflector spacing is made an odd number of wavelengths of the signals to be combined.

BRIEF DESCRIPTION OF THE DRAWINGS

FIG. 1 is a schematic side view of one embodiment of the invention.

FIG. 2 is a view of the input reflector viewed along lines 2—2 of FIG. 1.

FIG. 3 shows a wave launcher which can be utilized with the combiner of FIG. 1.

FIG. 4 illustrates the dimensional symbols used in the design of the novel combiner.

FIG. 5 shows how two reflectors may be mounted in a confronting relationship by means of a hollow dielectric cylinder.

FIG. 6 shows a front view of an input reflector to which the outputs of 8 different sources can be applied.

DETAILED DESCRIPTION OF A PREFERRED EMBODIMENT

In its essential form, the quasi-optical resonator for mm wavelengths power combining, as shown in FIG. 1, comprises two high reflectivity, highly polished metallic reflectors facing each other at a distance large compared to the operating wavelength, with suitable means for coupling the mm wave energy into and out of the cavity defined by the confronting mirrors or reflectors. Energy launched within the resonator from a plurality of mm wave signal sources, for example, oscillators, is reflected back and forth between the reflectors to form a standing wave pattern along the resonator axis. The resonator axis is the line connecting the centers of the reflectors, e.g., line 0—0 of FIG. 4.

The basic properties of quasi-optical resonators of this type can be derived from laser theory, which has been extensively reviewed by H. Kogelnik in a book entitled "Lasers", published by Marcel Dekker in 1966.

Some of the symbols used in the following analysis are shown in FIG. 4 which shows a resonator comprising two confronting concave spherical reflectors 7 and 9. The radius of curvature of the first reflector 7 being $R_1$, and that of reflector 9 being $R_2$. The reflectors have circular peripheries with radii of $r_1$ and $r_2$ for the reflectors 7 and 9, respectively, as illustrated. The reflector spacing, d, is the distance between the centers of the reflecting surfaces. The line 0—0 represents the resonator axis.

Stable resonators of this type are characterized by the following stability criterion:

$$0 \leqq g_1 g_2 \leqq 1 \quad \text{Eq. (1)}$$

wherein the g parameters are defined as:

$$g_1 = 1-(d/R_1), \text{ and } g_2 = 1-(d/R_2) \quad \text{Eq. (2)}$$

For simplicity, only resonators comprising congruent, circular reflectors are considered, thus:

$$R_1 = R_2 = R,\ g_1 = g_2 = g, \text{ and } r_1 = r_2 = r \quad \text{Eq. (3)}$$

Under these conditions, possible resonator arrangements range from the plane-parallel system wherein $R=\infty$ and $g=1$; the focal system wherein each spherical reflector has its focal point at the center of the other reflector and thus $d=R/2$ and $g=\frac{1}{2}$; the confocal system wherein $d=R$ and $g=0$, and the concentric system wherein $d=2R$ and $g=-1$.

The plane-parallel arrangement while theoretically possible is not ideal since a high degree of reflector flatness is required to keep diffraction losses low and the Q high, and the alignment for reflector parallelism is critical. Also, perturbations due to the presence of the launchers in the cavity make reflector alignment very difficult.

A dramatic decrease in diffraction losses results from the use of concave reflectors such as the spherical reflectors 7 and 9 of FIG. 1. Such a resonator provides the best approach for power combining of mm wave sources. The combiner of FIG. 1 comprises identical reflectors with equal radii of curvature and with their spherical surfaces confronting each other with a spacing, d, of between 1 and 2 times their common focal length. Since the focal length of a spherical reflector is one half the radius of curvature, if d is made equal to the focal length, a focal system, as defined above, results; and if d is made equal to 2 focal lengths or to R, the confocal system results.

The reflectors 7 and 9 preferably have circular peripheries as shown in FIGS. 2 and 6, and have uniform high reflectivity at the operating wavelength. This can be accomplished by providing the spherical surfaces 11 and 13 of the reflectors with a high conductivity surface, for example by plating with gold or silver or the like.

Input coupling is provided in the embodiment of FIG. 1 by a pair of dielectric launchers or antennas 15 located on either side of the center of the input reflector 7, as shown in FIG. 2. A single dielectric launcher 17 centrally mounted on the output reflector 9 provides output coupling to output waveguide 27. The input launchers 15 and the output launcher 17 comprise tapered dielectric rods of rectangular cross-section, as illustrated in FIG. 3 and may comprise polyethylene which has a relative permittivity of 2.25 and a loss tangent of 0.0002. Such launchers have a length of approximately 5 wavelengths of the operating frequency and will have a gain of 16.8 dB with half power beamwidth of 23° in the H-plane and similar characteristics in the E-plane.

The two oscillators 23 and 25 provide the signals to be combined and the outputs thereof are applied to the combiner cavity via waveguides 19 and 21, which terminate at the spherical surface of input reflector 7, with the launchers 15 inserted and supported in the open ends thereof, as shown in FIG. 3. A wedge shaped portion of the launchers extends into the waveguides to form a transition region. Launchers such as these will have a radiation pattern such that approximately 96% of the energy radiated thereby will strike the opposite or output reflector 9. The oscillators may be Gunn or IMPATT devices mounted in an enclosed cavity and suitably biased. The oscillator frequencies should be close but need not be identical.

The modes of this resonator are transverse electromagnetic ($TEM_{mnq}$) waves with negligible longitudinal field components. The transverse field distribution of the low order modes is closely confined around the axis of the resonator. The mode characteristics are governed by the reflector curvatures and reflector spacing provided that the apertures (or reflector diameters) are sufficiently large to intercept the bulk of the energy as it bounces back and forth between the reflectors. The resonant mode frequencies (or mode spectrum) of a stable open resonator of this type is governed by the following standing wave equation, which follows from the requirement that the phase shift of a resonator round trip of a mode is a multiple of $2\pi$. This leads to the following expression:

$$f_{mnq} = \left[ q + (m+n+1)\frac{\cos^{-1} \pm \sqrt{g_1 g_2}}{\pi} \right] \frac{c}{2d} \quad \text{Eq. (4)}$$

wherein m and n are the transverse mode numbers and q the axial mode number and c is the velocity of light. The mode number q indicates the number of half wavelengths of the standing wave pattern along the resonator axis. The axial mode separation or the frequency separation between two modes with the same transverse mode numbers and adjacent axial mode numbers is: $f_{mnq+1}-f_{mnq}=\Delta f=c/2d$. Each axial mode is split into a set of transverse mode resonance frequencies where spacing or mode density depends on the specific resonator type. For a confocal resonator, the symmetrical (m+n=even) transverse modes coincide with axial modes and the nonsymmetrical (m+n=odd) ones lie halfway between axial modes.

The fundamental or lowest order mode (m=n=0, $TEM_{ooq}$) is Gaussian in shape in cross-section and represents the mode with the lowest loss. This follows from the fact that higher order modes have field distributions extending farther from the resonator axis and hence a larger portion thereof is lost due to diffraction at the reflector edges.

The beam contour or edges are defined by hyperbolic curves and the beam radius of the fundamental or Gaussian mode is defined as the contour where the field amplitude has decreased to $e^{-1}$ of its axial value. Beyond this boundary the field and energy content of the beam rapidly decrease. The phase fronts of the propagating Gaussian mode are nearly spherical and thus match the shape of the reflecting surfaces. Thus with a symmetrical resonator of the type illustrated with identical reflector curvatures, the minimum beam size occurs in the center of the resonator and the beam radii at the resonator center, $W_o$, and at the reflector surfaces, W, are given by the following equations:

$$W_o=\left[\frac{d\lambda}{2\pi}\right]^{\frac{1}{2}}\cdot\left[\frac{1+g}{1-g}\right]^{\frac{1}{4}} \quad \text{Eq. (5)}$$

and, $$W=\left[\frac{d\lambda}{\pi}\right]^{\frac{1}{2}}\cdot\left[\frac{1}{1-g^2}\right]^{\frac{1}{4}} \quad \text{Eq. (6)}$$

The hyperbolic shape, 8, of the beam and its radii $W_o$ and W are illustrated in FIG. 4.

Feedback coupling or signal interaction can occur between the cavity resonant mode and the individual enclosed cavities which comprise the oscillators 23 and 25. This can result in the frequency locking of the oscillators to the cavity resonant frequency. The IMPATT and Gunn devices used as mm wave oscillators have a negative resistance over a large frequency range and are thus capable of oscillation over a large bandwith. Thus a plurality of such oscillators which may individually have slightly different frequencies of oscillation, will all become locked to the resonant frequency of the high-Q open cavity. Thus the system of FIG. 1 may be considered as a single oscillator with a pair of active elements and with the quasi-optical cavity comprising the frequency determining element thereof. Also, the high-Q cavity with its narrow bandwidth results in greatly reduced frequency modulation noise compared to the outputs of oscillators 23 and 25.

Since the energy maximum of the Gaussian beam occurs at the resonator axis, the output launcher 17 is centrally located on the output reflector. The launcher 17 is similar to input launchers 15 and is similarly mounted and supported by waveguide 27.

A good approximation for the Q of a resonator is given by:

$$Q=(2\pi d/a\lambda) \quad \text{Eq. (7)}$$

wherein a is the fraction of power loss per reflection including reflection and diffraction losses. Reflection losses from polished high conductivity reflector surfaces at mm wavelengths are negligible. Diffraction losses for the low order modes are small provided that the Fresnel number, N, is much larger than unity. This number is given by the following relationship:

$$N=(r^2/\pi d) \quad \text{Eq. (8)}$$

In practice a Fresnel number of 5 or more is desired to achieve acceptable Q values which will result in good combining efficiency.

Parabolic reflectors can also be used for this open resonator, since they closely approximate spherical surfaces. As used herein the word "concave" is meant to encompass both spherical and parabolic reflectors.

The combiner of FIG. 1 was built and tested to demonstrate the feasibility of this concept. The focal system as defined above was chosen using two identical spherical reflectors of highly polished aluminum with reflector radii, r, of 7.5 cm, radii of curvature, R, of 30 cm, a focal length of 15 cm, and reflector spacing, d, of 15 cm. The two oscillators 23 and 25 were both InP Gunn types with respective frequencies of 60.07 and 60.03 GHz and power outputs of 30.5 and 29.5 milliwatts. The Gunn devices were mounted in an N-34 package and operated in a coaxial waveguide circuit with bias tuning for frequency adjustment. No isolator was used to permit feedback coupling and the aforementioned frequency locking to the combiner cavity. This structure resulted in a Fresnel number of 7.5 and a minimum beam radius, $W_o$ of 1.44 cm which broadened by diffraction to a radius W of 1.66 cm at the reflector surfaces. These beam dimensions are applicable to the dominant Gaussian mode. Thus the beam occupies only a small area in the center of the cavity aperture. Also, the longitudinal mode separation, Δf, was 1.0 GHz. Since the wavelength was approximately 0.5 cm there were about 30 wavelengths in the standing wave pattern between the reflectors.

In tests on this apparatus, a spectrum analyzer was connected to the output waveguide 27 and as the reflector spacing, d, was varied with a micrometer type mechanism, the two oscillator frequencies could be seen merging to a single frequency as resonance occurred. Also, a definite beam narrowing was observed along the resonator axis at resonance. There was some diffraction noted at the reflector edges which reduced efficiency somewhat.

In practice it would be desirable to combine the outputs of numerous mm wave sources with resonators of this type. FIG. 6 shows a front view of an input reflector to which the outputs of 8 different sources can be applied. The ends of 8 waveguides, 29 are shown terminating in a circular array centered on the resonator axis, O. All of these waveguides would include suitable launchers like those of FIGS. 1 and 3.

FIG. 5 shows how the resonator can be mounted and supported by means of a cylindrical tube 31 of dielectric material which is transparent to the waves involved. Such a resonator would still be considered "open" since the cylinder 31 is transparent. Means could be provided to adjust the position of one of the reflectors back and forth to adjust the spacing, d, and thus provide a tuning adjustment. The reflectors need not have circular peripheries, but this shape may be the most practical. FIG. 5 is a cross-sectional view across the diameter of the resonator.

While this resonator is similar to those used in lasers, it differs therefrom in that the mm wavelength energy must be applied thereto from external sources, whereas in laser applications, the laser energy source or gain cell would be located within the resonator.

While the invention has been described in connection with illustrative embodiments, obvious variations therein will occur to those skilled in the art, accordingly the invention should be limited only by the scope of the appended claims.

We claim:

1. A millimeter wavelength power combiner comprising an open resonator comprising a pair of confronting concave reflectors, means to apply the outputs of two or more millimeter wavelength signal sources to said resonator in such a way that the power of the signal sources is combined to form standing waves in the transverse electromagnetic mode along the axis connecting the centers of said reflectors, and means to withdraw the combined power from said resonator.

2. The power combiner of claim 1 wherein said reflectors have circular peripheries with diameters at least 10 times the operating wavelength and the reflector spacing, d, is also at least 10 times the operating wavelength.

3. The power combiner of claim 1 wherein said reflectors are spherically curved and have a Fresnel number, N, of 5 or more with the reflector spacing, d, of between 1 and 2 times their common focal length.

4. The power combiner of claim 1 wherein said signal sources are applied to said resonator by means of a plurality of waveguides which terminate near the center of one of said reflectors, each of the ends of said waveguides having a tapered dielectric rod inserted therein, and said means to withdraw the combined power comprises a waveguide terminating at the center of the said other reflector, said last-named waveguide having a tapered dielectric rod inserted therein.

5. The power combiner of claim 1 wherein said signal sources all have operating frequencies of approximately 60 GHz and said reflectors comprise spherical surfaces both with radii of curvature, R, of 30 cm, radii, r, of 7.5 cm and reflector spacing, d, of 15 cm.

6. A millimeter wavelength power combiner comprising an open resonator comprising a pair of confronting concave reflectors, said resonator having dimensions in any direction of at least 10 wavelengths of the signals to be combined, means to apply a plurality of millimeter wave signals from two or more signal sources to said combiner in such a way that at least 95% of the power from the signal sources is combined to form standing waves in the transverse electromagnetic mode in a region within 2 cm of the resonator axis, with minimal diffraction losses, and means to withdraw the combined power from said combiner.

7. The power combiner of claim 6 wherein the Fresnel number, N, thereof is 5 more.

8. The power combiner of claim 6 wherein said signal sources comprise negative resistance solid state oscillators which all become frequency locked to the resonant frequency of said resonator, as a result of feedback between said resonator and said signal sources.

9. A power combiner comprising a pair of spherically curved reflectors with high conductivity spherical surfaces and circular peripheries, one of said reflectors being the input reflector and the other being the output reflector, a plurality of millimeter wave signal sources applied to said resonator by means of a like plurality of waveguides which terminate near the center of said input reflector and which have dielectric rods inserted therein to direct the waveguide outputs towards said output reflector, one output waveguide terminated at the center of said output reflector and having similar dielectric rod inserted therein, the radii, r, of said reflectors and their spacing, d, being at least 10 times the operating wavelength, whereby the millimeter power applied thereto will form standing waves predominantly in the Gaussian TEM mode within 2 cm of the resonator axis, with minimal power loss due to diffraction and higher order modes.

10. The power combiner of claim 9 wherein the resonator spacing, d, is equal to the focal length of said spherically curved reflectors, the radii, r, of said reflectors are both 7.5 cm and said reflectors are mounted in opposite ends of a hollow dielectric cylinder.

* * * * *